(12) United States Patent
Reimann et al.

(10) Patent No.: US 8,845,805 B2
(45) Date of Patent: Sep. 30, 2014

(54) DEVICE AND METHOD FOR PRODUCING CRYSTALLINE BODIES BY DIRECTIONAL SOLIDIFICATION

(75) Inventors: Christian Reimann, Aurachtal (DE); Jochen Friedrich, Eckental (DE); Marc Dietrich, Grossschirma (DE)

(73) Assignee: Solarworld Industries Sachsen GmbH, Freiberg (DE)

( * ) Notice: Subject to any disclaimer, the term of this patent is extended or adjusted under 35 U.S.C. 154(b) by 1080 days.

(21) Appl. No.: 12/866,497

(22) PCT Filed: Feb. 14, 2008

(86) PCT No.: PCT/DE2008/000275
§ 371 (c)(1),
(2), (4) Date: Aug. 6, 2010

(87) PCT Pub. No.: WO2009/100694
PCT Pub. Date: Aug. 20, 2009

(65) Prior Publication Data
US 2010/0320638 A1    Dec. 23, 2010

(51) Int. Cl.
*C30B 11/14* (2006.01)
*C30B 29/06* (2006.01)
*C30B 11/00* (2006.01)

(52) U.S. Cl.
CPC ............... *C30B 11/003* (2013.01); *C30B 29/06* (2013.01); *C30B 11/006* (2013.01)
USPC ................. 117/81; 117/82; 117/83; 117/200; 117/933

(58) Field of Classification Search
USPC .............................. 117/81, 82, 83.2, 200, 933
See application file for complete search history.

(56) References Cited

U.S. PATENT DOCUMENTS

| | | | | | |
|---|---|---|---|---|---|
| 5,988,257 | A  | * | 11/1999 | Hugo | 164/122.1 |
| 6,378,835 | B1 | * | 4/2002  | Wakita et al. | 249/78 |
| 7,210,516 | B2 | * | 5/2007  | Wakita et | 164/259 |
| 2009/0266396 | A1 | | 10/2009 | Niira et al. | 136/244 |

FOREIGN PATENT DOCUMENTS

DE    10 2006 017 622 B4    3/2008    ............. C30B 11/00

\* cited by examiner

*Primary Examiner* — Bob M Kunemund
(74) *Attorney, Agent, or Firm* — Renner Kenner Greive Bobak Taylor & Weber (57) ABSTRACT

The invention relates to a device and a method for producing crystalline bodies by directional solidification. The device comprises a melting furnace (11) having a heating chamber (12) in which at least one supporting surface (13) for a crucible (8) and at least one gas purging device arranged above the supporting surface (13) and having a gas outlet facing the supporting surface (13) are defined. An embodiment of the device is characterized in that the gas outlet is defined by one or more openings in a lower plunger surface of a plunger-shaped element (2) which has a geometry adapted to the inner shape of the crucible (8), said shape allowing an at least partial insertion of the plunger-shaped body (2) into the crucible (8). The gas purging device and/or the supporting surface (13) comprise an adjusting mechanism or are designed to be adjustable in such a manner that they allow an adjustment of a perpendicular distance between the supporting surface (13) and the plunger-shaped body (2). The device and the corresponding method allow carbon- and oxygen-containing materials to be discharged from the melt more efficiently and in a controlled manner. The device and the method thus allow—within certain limits—a specific adjustment of the carbon and oxygen content of the crystalline bodies.

8 Claims, 8 Drawing Sheets

Fig. 6

DEVICE AND METHOD FOR PRODUCING CRYSTALLINE BODIES BY DIRECTIONAL SOLIDIFICATION

CROSS-REFERENCE TO RELATED APPLICATION

This is a §371 application of International patent application number PCT/DE2008/000275 filed Feb. 14, 2008, which is incorporated herein by reference.

TECHNICAL AREA OF APPLICATION

The invention relates to a device for producing crystalline bodies by directional solidification, which encompasses a melting furnace with a heating chamber, in which are defined at least one supporting surface for a crucible and at least one gas purging device arranged over the supporting surface with a gas outlet facing the supporting surface. The invention also relates to a method for producing crystalline bodies by directional solidification using the device.

Known for the massive crystal cultivation of silicon crystals in addition to cultivating monocrystalline silicon according to the Czochralksi procedure and floating zone procedure are several established methods for producing multicrystalline silicon, which all take place based on the principle of directional solidification. During the production of crystalline bodies by directional solidification, the raw material is initially melted and then solidified in a crucible via controlled heat dissipation from the bottom up. This production process yields multicrystalline material, for example for the production of silicon-based solar cells. In addition, the method also utilizes the segregation effect to purify metallurgic silicon.

PRIOR ART

However, the production of multicrystalline silicon blocks by directional solidification can lead to elevated carbon and oxygen concentrations in the multicrystalline material. The latter result from uncontrolled contamination by substances from furnace fixtures, the crucible and the silicon raw material. For example, handling the parent material during storage and installation in the crystallization system can cause uncontrolled contamination through the adhesion of carbon and oxygen-containing phases to the raw material surface even before the crystallization process. In addition, the interior of currently available crystallization systems consists predominantly of fixtures made of graphite, such as support crucibles, heaters or insulation materials. As a consequence, carbon inevitably and uncontrollably comes into contact in the form of oxidation products of the graphite with the raw material or melt, and finally is incorporated into the solidified silicon. The carbon-containing species is here transported to the raw material or melt predominantly via the gas phase within the device. Another source of contamination for carbon and oxygen is the crucible and its $Si_3N_4$ coating. The foreign substances are here introduced via contact with the melt, either through etching and particle erosion, or as the result of diffusion from the crucible material.

If an elevated contamination of carbon and oxygen takes place in the silicon material, oxygen and carbon-containing occlusions or deposits form in the melt or solid multicrystalline bodies once the solubility limit has been exceeded. These influence whether multicrystalline silicon can be used in the production of solar cells, since carbon and oxygen in the multicrystalline silicon can have a positive or negative impact on the subsequent solar cell properties. Therefore, it is necessary that the carbon and oxygen content be monitored as effectively as possible during directional solidification.

One known way of influencing the carbon and oxygen concentration in silicon has to do with realize a suitable stream of gas over the melt surface, which transports away the carbon and oxygen-containing substances. For example, we know from Czochralski monocrystal cultivation of silicon that monocrystalline silicon material with a defined carbon content can be generated via gas purging. In addition, defined gas purging while producing silicon monocrystals via the Czochralski process also influences the evaporation of SiO over the silicon melt surface, and hence the oxygen content in the crystal.

U.S. Pat. No. 6,378,835 B1 discloses the use of gas purging for influencing the carbon and oxygen content in the subsequent crystalline body during the production of multicrystalline silicon by directional solidification as well. The method in this publication uses a melting furnace with a gas purging device having a central, immovable pipe positioned above the melt surface.

However, the risk posed by gas purging units with gas feed lines located far away from the melt surface is that an outwardly directed stream of gas will not form above the entire melt surface. But this flow pattern is required for efficiently discharging the contamination, and prevents carbon and oxygen from other components of the melting furnace from being transported toward the melt. At too great a distance, reflux effects may arise, as a result of which carbon or oxygen is again transported to the surface of the melt, and can get into the melt. Further, the large gas volume over the melt surface keeps the achievable gas velocities low, and hence makes for an ineffective discharging of contaminants.

DESCRIPTION OF THE INVENTION

The object of the present invention is to indicate a device and method for producing crystalline bodies by directional solidification, in which carbon and oxygen-containing contaminants can be discharged from the melt surface more effectively and controllably.

The object is achieved with the device according to claims 1 and 2, as well as with the method according to claim 10. Advantageous embodiments of the device and method are the subject of the dependent claims, or may be gleaned from the following description and exemplary embodiments.

In a first alternative, the proposed device in a known manner encompasses a melting furnace with a heating chamber, in which are formed at least one supporting surface for a crucible having a lateral wall and a floor, and at least one gas purging device situated over the supporting surface and having a gas outlet facing the supporting surface. The device is characterized in that the gas outlet is formed by one or more openings in a lower plunger surface of a plunger-shaped body, which has a geometry adapted to the inner shape of the crucible, permitting at least a partial insertion of the plunger-shaped body into the crucible at a lateral distance to the lateral wall of the crucible. The device is further characterized by the fact that the gas purging device and/or supporting surface are situated or mounted so that they can be adjusted in an axial direction, thereby enabling the adjustment or modification of a perpendicular distance between the support and plunger-shaped body.

The adjustability of the distance between the plunger-shaped body of the gas purging device and the supporting surface, and hence the crucible or melt surface of a material melted in the crucible on the one hand and the geometry of the plunger adjusted to the crucible on the other makes it possible to position the gas outlet over and relatively close to the melt surface, and concentrate the gas flow on the gap between the plunger-shaped body and the melt surface as well as the lateral wall of the crucible. This yields high gas velocities over the melt, and hence a highly effective discharging process. High gas velocities also automatically generate high shearing forces on the melt surface, which positively influence melt convection. Melt convection is important, since the carbon and oxygen in the melt must be transported toward the melt surface via convection. The introduced gas can be discharged form the system again through a suitable gas outlet. As a result, the adjustability of the perpendicular distance between the plunger-shaped body and melt surface makes it possible to better control flow conditions, and hence the subsequent carbon and oxygen content of the crystallized material. Since the fill level of the material in the crucible can change during processing, the proposed device makes it possible to maintain a distance to the melt surface that is always constant by adjusting the gas purging device and/or supporting surface. For example, the fill level changes in the heating process owing to the initially loose bulk of the parent material, and can additionally vary from one batch to the next. After the parent material has been melted, the resultant fill level is smaller, and can change once again when using so-called recharging units and refilling the parent material. The device also enables a variation of the distance between the lower plunger surface of the plunger-shaped body and the melting surface during the crystallization process, should this be necessary for the desired production result, in particular for the desired carbon and oxygen content of the crystalline body.

The proposed device along with the proposed method make it possible to set and maintain a critical distance for the gas outlet relative to the melt surface during a complete crystallization process, and hence to produce crystalline bodies, in particular multicrystalline silicon blocks, with defined carbon and oxygen contents. The structural design also allows having the natural melt bath convection be driven by the gas purging process, thereby enabling a more homogeneous distribution of doping and foreign substances, which further improves the material quality of the cultivated crystalline body. For example, the device makes it possible to generate multicrystalline silicon bodies having carbon concentrations of $<1 \times 10^{17}$ atoms/cm$^3$ and oxygen concentrations of $<1 \times 10^{16}$ atoms/cm$^3$.

The proposed device according to the second alternative offers the same advantages already described above. This second alternative differs from the already described first alternative only in that the gas purging device exhibits several side-by-side plunger-shaped bodies with corresponding gas outlet openings, which are adjusted in their entirety to the geometry of the crucible. Such a configuration is advantageous above all in cases where an expanded melt surface is present due to larger lateral dimensions of the crucible. The effect of the plunger-shaped body of the device described above is here distributed over several plunger-shaped bodies arranged side by side, which can also be adjusted independently of each other in the direction of the melt surface, but are as a rule adjusted or moved together.

The plunger-shaped body or group of plunger-shaped bodies here preferably exhibits a geometry that enables a unilaterally identical distance to the lateral wall of the crucible when introducing the plunger-shaped body or group of plunger-shaped bodies into he crucible. This lateral distance preferably lies at ≤1 cm. The lower side of the plunger is here flat in the preferred configuration, leaving an overall constant perpendicular distance relative to the met surface as well.

During implementation of the method, the gas flow and distance to the melt surface and lateral wall of the crucible are preferably selected or set in such a way as to achieve a laminar stream in the gaps between the plunger-shaped body and melt or crucible. Different plunger-shaped bodies can here be provided for varying sizes and geometric shapes of crucibles, which are replaced for the gas purging device as well when changing out a crucible for another with a different geometry. In this way, a plunger-shaped body always tailored to the crucible can be used in the gas purging device.

The gas purging device here preferably consists of a graphite-free material to prevent the transport of carbon-containing material via the gas purging unit to the melt surface.

Therefore, the cited device and accompanying method make it possible to control the carbon and oxygen content in the solidified crystalline material during a complete cultivation process over the gas phase. The gas outlet that can be adjusted in terms of its distance to the melt surface and is incorporated in a plunger-shaped body makes it possible to set a critical height over the melt and ensure a screen relative to the enveloping section of the device. Supplying a defined flow of inert gas at the right process times makes it possible to achieve a controlled incoming and outgoing transport of the respective undesired substances. An elevated gas purging quantity here also impacts the natural melt bath convention. Depending on which direction the natural convection is flowing on the melt surface, this stream of gas can drive or decelerate the flow in the melt. As a consequence of this gas/melt interaction, a more homogeneous radial distribution of the foreign or doping substances can be achieved within the crystalline body.

In the proposed device, the gas purging device is preferably adjustably spaced apart from the melt surface. However, the supporting surface for the crucible can be vertically adjustable in design as an alternative or in combination, of course. The adjustment can here be initiated both manually and by way of a drive, e.g., a motor.

Different parameters can be varied during the operation of the device for producing crystalline bodies. For example, the gas flow or distance to the melt surface can be varied during the process. In addition, different gases can be used for gas purging in the course of the cultivation process.

The device and method are very advantageously suited for producing multicrystalline silicon bodies of the kind used in solar cells. However, the device can of course also be used for producing other crystalline bodies, e.g., monocrystalline semiconductors or optical crystals by directional solidification. The device is also suitable for purifying metallurgical silicon.

BRIEF DESCRIPTION OF DRAWINGS

The proposed device as well as the accompanying method will be described again briefly below based on exemplary embodiments in conjunction with the drawings. Shown on.

WAYS OF IMPLEMENTING THE INVENTION

Figure 1A:
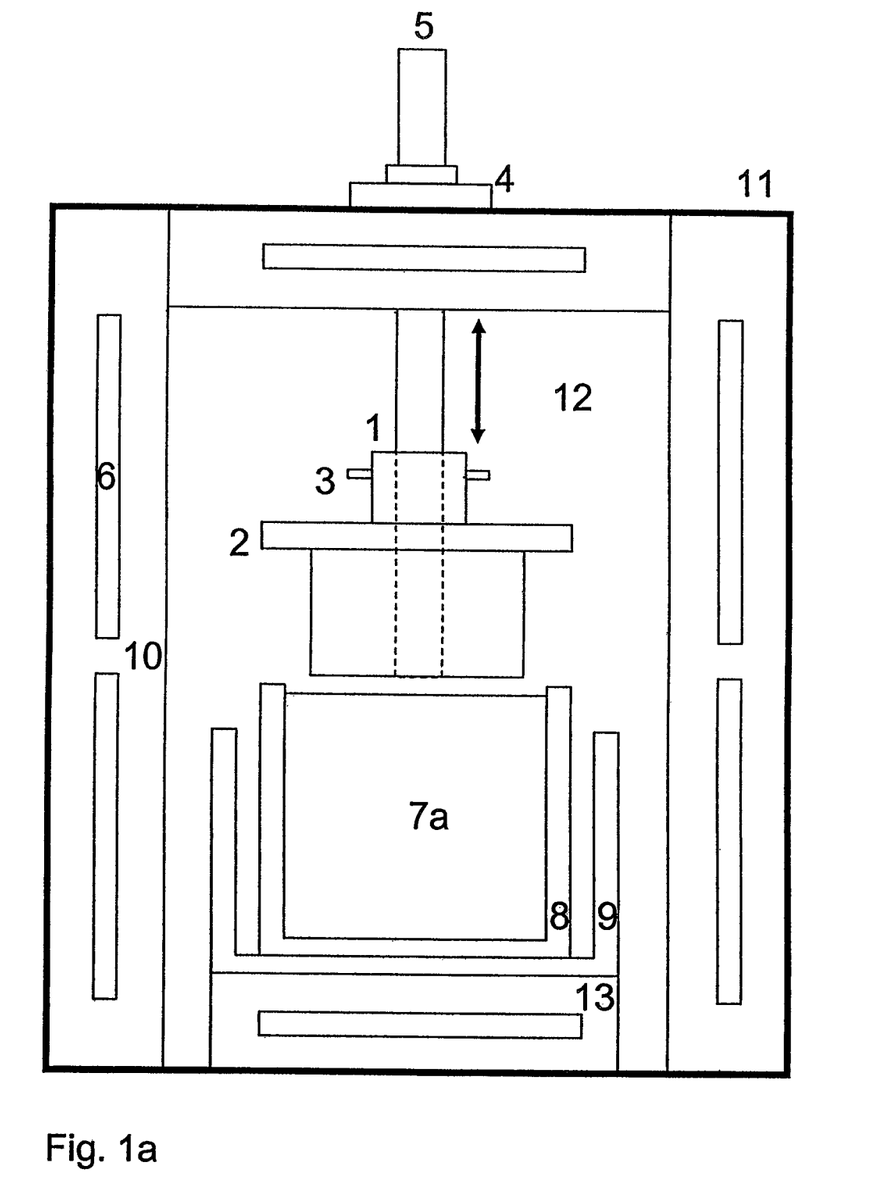
FIG. 1 is a schematic view of an example for an embodiment of the device.
Figure 1B:
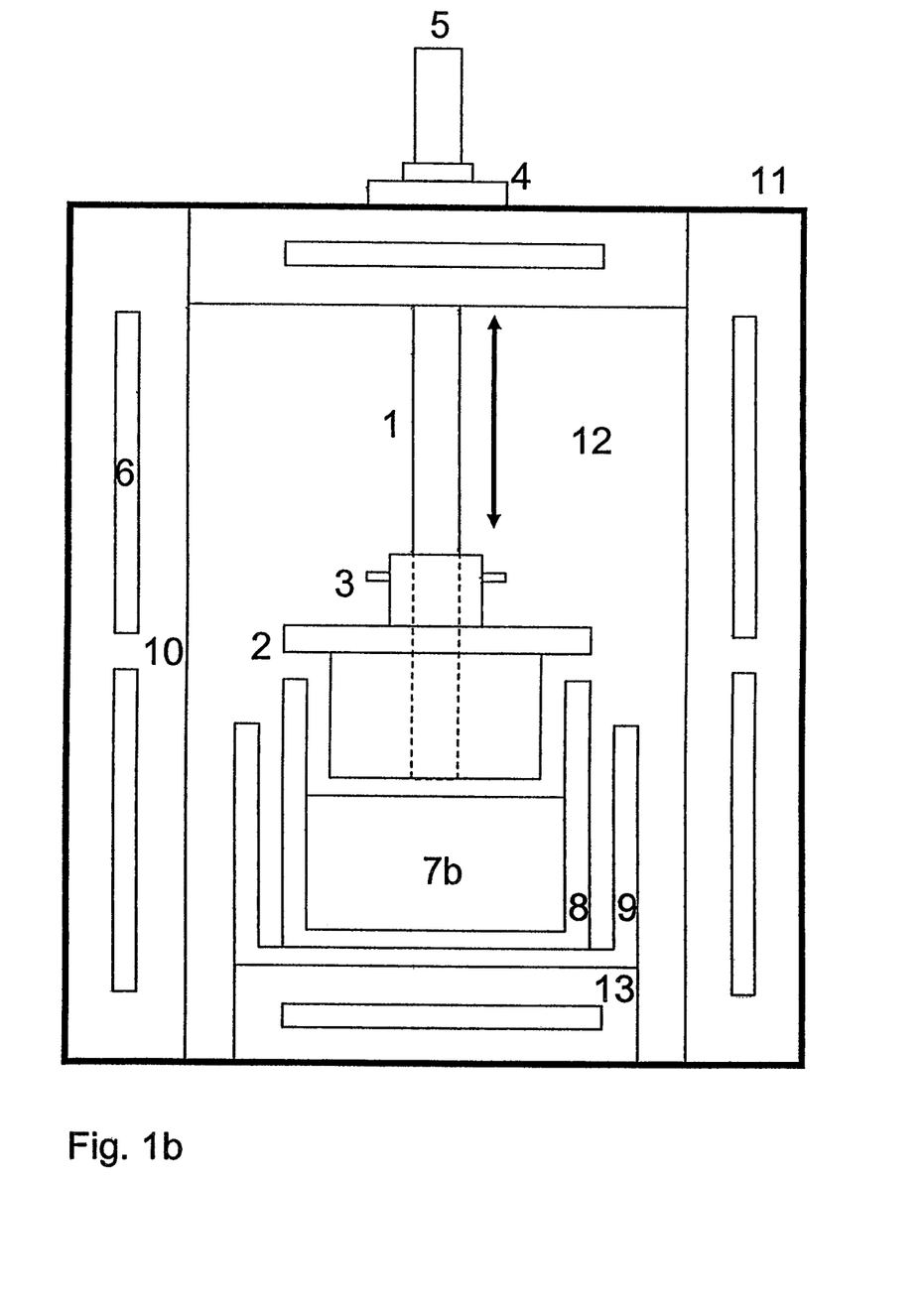

FIG. 1 presents a schematic view of a first example for an embodiment of the proposed device. FIG. 1a here represents a state before and during the melting process, while FIG. 1b depicts a state during the crystallization process. The device in this exemplary embodiment is essentially distinguished by the configuration of the gas purging unit of known devices. The device encompasses the melting furnace 11 with integrated heating elements 6, the insulation material 10 and a heating chamber 12, which incorporates a supporting surface 13 for the crucible 8. The graphite-free gas purging device encompasses a pipe 1 made of aluminum oxide, to which a plunger 2 made of aluminum oxide is secured via a wire connector 3, e.g., consisting of a molybdenum-lanthanum wire. The gas purging device is incorporated into the heating chamber 12 of the melting furnace 11, and screwed to the latter via a central hole in the cover of the melting furnace. The crimp connection 4 between the pipe 1 and cover of the melting furnace selected in the present example makes it possible to vary the axial position of the plunger 2 in a defined manner at different system pressures and over the entire process, as denoted by the double arrow on FIG. 1. The system atmosphere in the heating chamber 12 can here not interact with the outside atmosphere, since the crimp connection is gastight. An external gas feed line 5 connected at the upper end with the aluminum oxide pipe 1 can be used to introduce scavenging gas in the center of the heating chamber 12 at a defined height over the silicon raw material or silicon melt. The silicon raw material 7a is here introduced into the crucible 8, which in the present example consists of quartz glass, and is provided with a $Si_3N_4$ coating. The crucible 8 is arranged in a graphite support crucible 9, which stands on the supporting surface 13 of the heating chamber 12.

The plunger 2 is adjusted to the geometry of the crucible 8 in such a way that this plunger 2 can be introduced at least partially into the crucible while maintaining a distance from its lateral wall. The lower side of the plunger has a gas outlet opening for the supplied scavenging gas, as denoted with the dashed lines on the figure. The plunger geometry is round given a crucible with a round cross sectional area, while it is correspondingly angular given a crucible with an angular cross sectional area. At a distance away form the lower side of the plunger, the plunger on FIG. 1a has a continuous projection, with which the upper edge of the crucible 8 can be completely covered.

This configuration of the gas purging device makes it possible to introduce the scavenging gas via the external gas feed line 5 at a defined height over the silicon raw material 7a or silicon melt 7b (see FIG. 1b). In addition, a peripheral mass flow regulator (not shown) can be used to set the gas flow quantity that gets through the pipe 1 and plunger 2 into the crucible 8. The key to achieve an optimal performance for the gas purging device is the adjusted shape of the used plunger 2. In order to obtain an optimal interaction between the used gas phase and the raw material or melt, a critical distance between the latter or its surface must be realized. The proposed configuration of the gas purging device with adjusted plunger geometry and adjustable distance makes it possible to maintain this critical distance between the lower side of the plunger and surface of the raw material or melt at all times in the process. As a result, it is also possible to balance the change in fill level from the loosely poured raw material 7a to the liquid melt 7b while melting the silicon raw material in the crucible by axially shifting the plunger 2. The plunger 2 is here moved into the crucible 8, but does not come into contact with the crucible 8 or melt. This is depicted on FIG. 1b, where the plunger 2 was lowered more deeply into the crucible 8, so as to maintain a constant distance to the surface recessed by the melting process. Having the gas purging unit, in particular of the pipe 1, the plunger 2 and the gas feeder 5 consist of a graphite-free material helps make the operation of the gas purging unit more efficient.

Figure 3A:
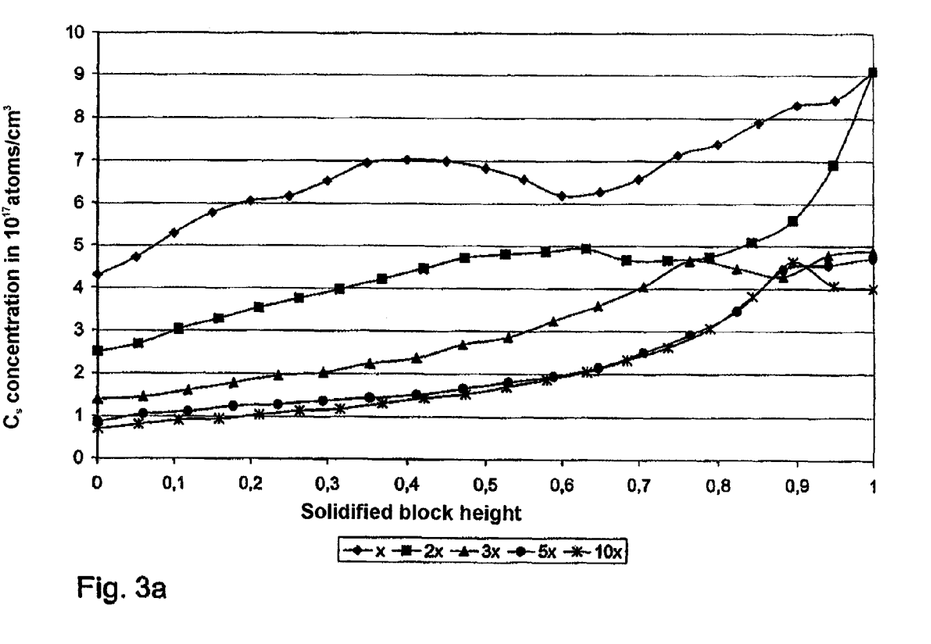
FIG. 3 is the carbon and oxygen concentration over the solidified block height of multicrystalline silicon as a function of the used gas purging quantity x.
Figure 3B:
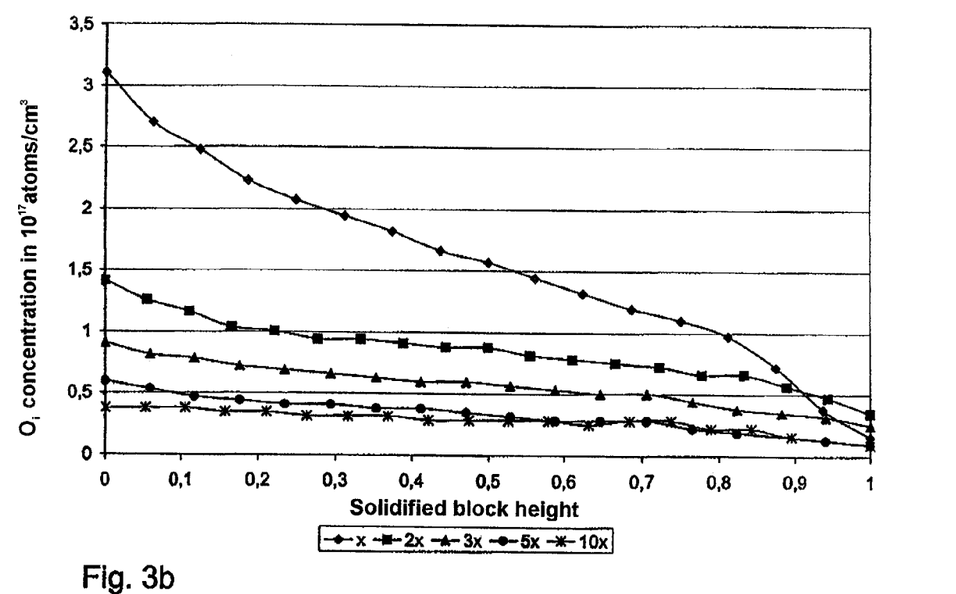

Another important parameter for the effective operation of the gas purging unit is gas purging quantity. It influences the quantity of carbon and oxygen-containing species that is transported to or from the raw material and melt. The crucial parameter here is regarded as the ratio of gas volume in the crucible below the plunger 2 to the introduced gas purging quantity. FIGS. 3a and 3b here depict the carbon and oxygen content in the multicrystalline silicon produced with the device as a function of the used gas purging quantity x. As clearly evident from the presented measuring results, using the gas purging unit with an elevated gas purging quantity enables a significant reduction in the carbon and oxygen content. Depending on the gas purging quantity, this provides an opportunity to specifically set the desired concentration of corresponding foreign substances in the solid body.

Figure 4:
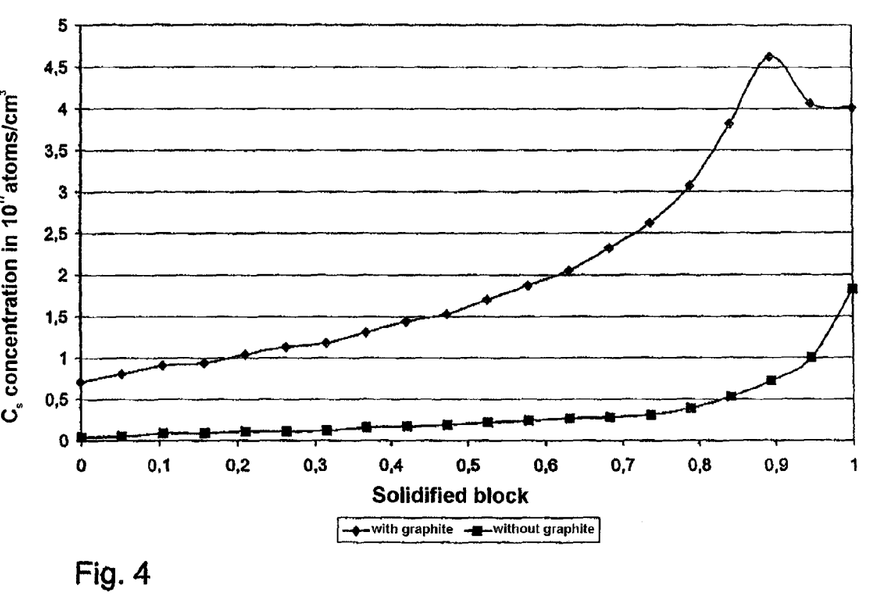
FIG. 4 is the carbon concentration over the solidified block height of multicrystalline silicon as a function of the used gas purging device.

FIG. 4 shows the influence of the material of the gas purging device on the result of crystal cultivation. A gas purging unit made of graphite-free material was here selected in one case, and a gas purging unit made of a graphite-containing material in the other case. The clear difference in carbon concentration in the cultivated multicrystalline silicon body is clearly evident from the figure.

Figure 5:
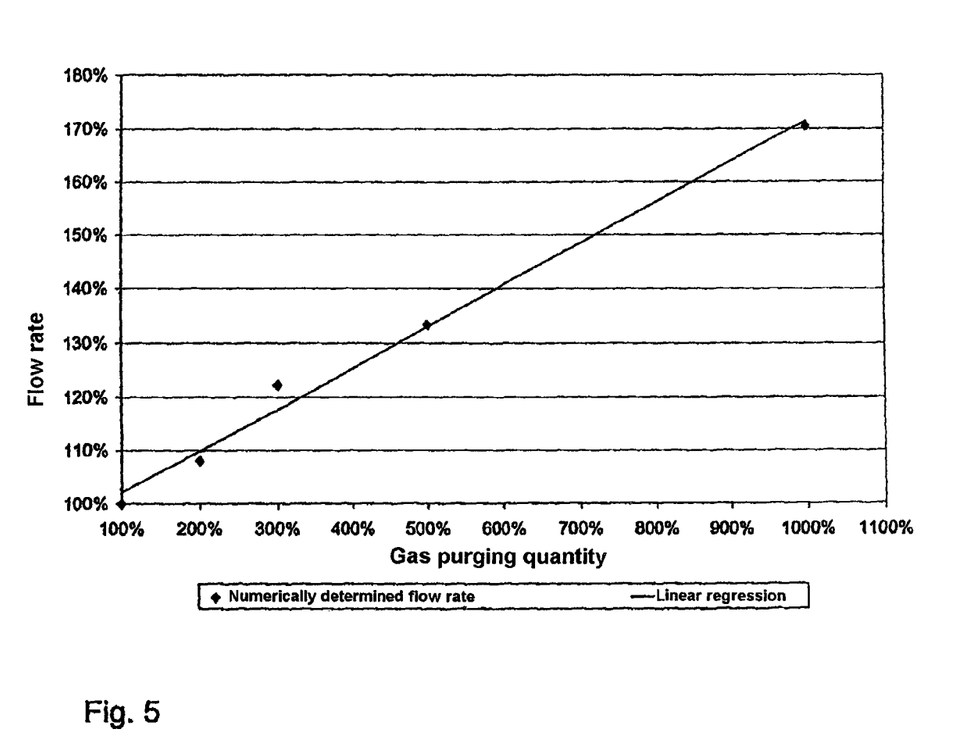
FIG. 5 is the flow rate of the melt bath as a function of the used gas purging quantity.
Figure 6:
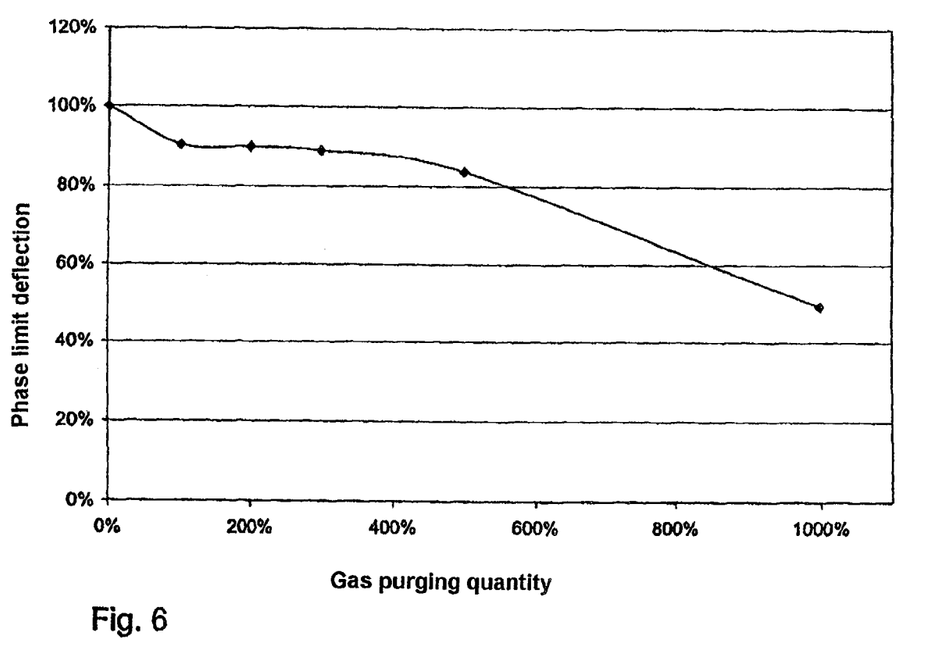
FIG. 6 is a numerically determined deflection of the liquid-solid phase limit as a function of the used gas purging quantity.

The proposed embodiment of the gas purging device with a plunger-shaped body that can be positioned close to the melt surface also makes it possible to use the gas flow to positively influence the convention in the melt bath. FIG. 5 here shows that increasing the gas purging quantity results in an increase in the flow rates inside the melt. As depicted on FIG. 6, this reduces the deflection of the solid-liquid phase boundary, hence yielding a more homogenous, radial distribution of doping and foreign materials inside the multicrystalline silicon material.

Figure 2:
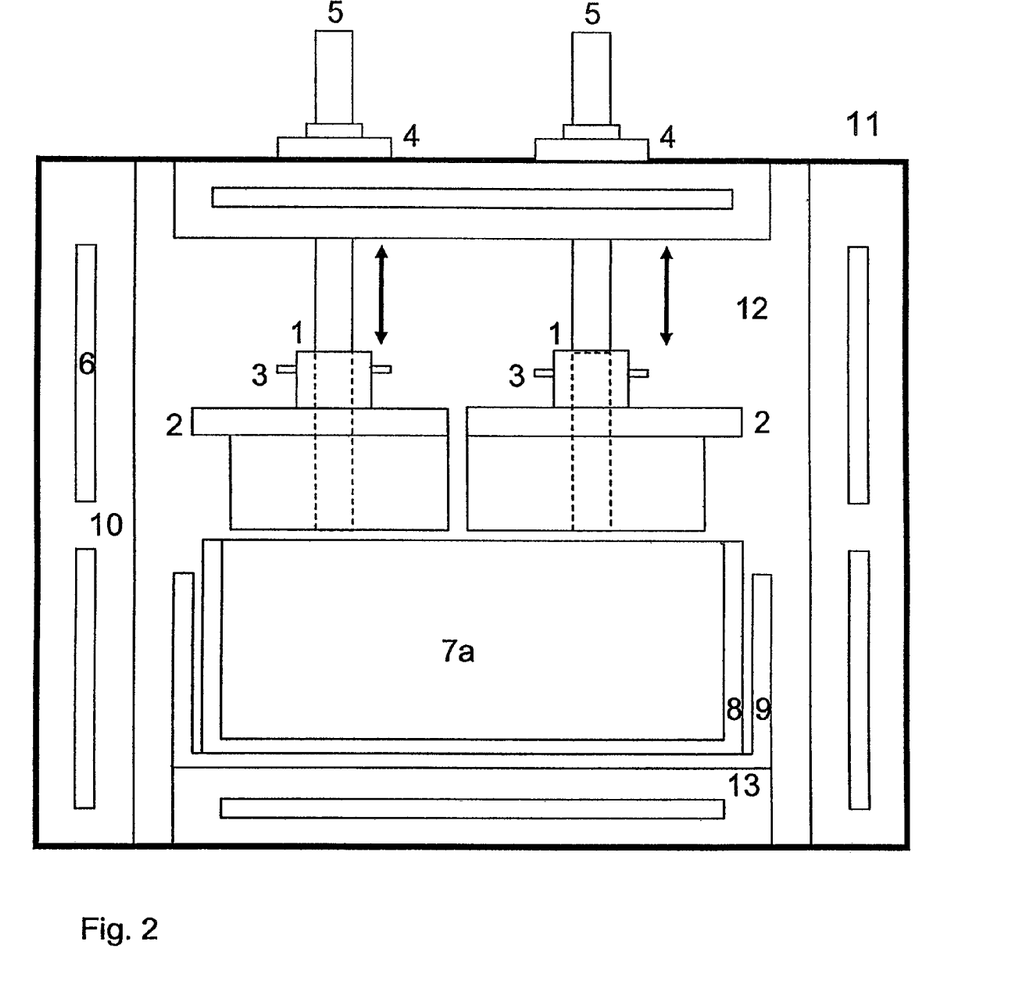
FIG. 2 is a schematic view of another example for an embodiment of the device.

Finally, FIG. 2 shows another example for an embodiment of the proposed device, wherein two plungers 2 are used one next to the other in the gas purging device in this example. The crucible 8 can here have an elongated rectangular shape, wherein the cross sectional surface of this crucible 8 is essentially covered by the two plungers 2, i.e., except for the gap toward the lateral wall of the crucible 8. The same components in this device are provided with the same reference numbers as for the device on FIG. 1, so that these components will no longer be discussed in any greater detail given their identical design and function. This example provides two external gas feeders 5, which are connected with the two pipes 1. Both pipes 1 each have a plunger 2, which exhibits a gas outlet on the lower side of the plunger. Both plungers 2 can be axially shifted as denoted by the double arrows, making it possible to set the desired distance to the surface of the raw material 7a or melt. This device operates in the exact same way as the device on FIG. 1, wherein both plungers 2 are here moved simultaneously. Such a configuration enables the use of crucibles 8 with larger lateral dimensions without tightening the requirements on the mechanical stability of the suspension device for the individual plungers 2.

REFERENCE LIST

1 Pipe
2 Plunger

3 Wire connector
4 Crimp connection
5 Gas feeder
6 Heating element
7a Raw material
7b Melt
8 Crucible
9 Support crucible
10 Insulation
11 Melting furnace
12 Heating chamber
13 Supporting surface

The invention claimed is:

1. A device for producing crystalline bodies by directional solidification, which encompasses a melting furnace with a heating chamber, in which are defined at least one supporting surface for a crucible having a lateral wall and floor, and at least one gas purging device arranged over the supporting surface with a gas outlet facing the supporting surface, characterized in that the gas outlet is formed by one or more openings in a lower plunger surface of a plunger-shaped body, which has a geometry adapted to the inner shape of the crucible, permitting at least a partial insertion of the plunger-shaped body into the crucible at a lateral distance to the lateral wall of the crucible, that the gas purging device and/or supporting surface are situated or mounted so that they can be adjusted in an axial direction, thereby enabling a change in the perpendicular distance between the supporting surface and plunger-shaped body, and that the plunger-shaped body has a continuous lateral projection at a distance from the lower plunger surface that makes it possible to completely cover an upper edge of the crucible.

2. A device for producing crystalline bodies by directional solidification, which encompasses a melting furnace with a heating chamber, in which are defined at least one supporting surface for a crucible having a lateral wall and floor, and at least one gas purging device arranged over the supporting surface with a gas outlet facing the supporting surface, characterized in that the gas outlet is formed by one or more openings in lower plunger surfaces of a group of several side-by-side plunger-shaped bodies, which has a geometry adapted to the inner shape of the crucible, permitting at least a partial insertion of the group of plunger-shaped bodies into the crucible at a lateral distance to the lateral wall of the crucible, and that the gas purging device and/or supporting surface are situated or mounted so that they can be adjusted in an axial direction, thereby enabling a change in the perpendicular distance between the supporting surface and plunger-shaped body.

3. The device according to claim 1, characterized in that the plunger-shaped body has a geometry that enables at least a partial insertion of the plunger-shaped body into the crucible at a unilaterally identical distance to the lateral wall.

4. The device according to claim 2, characterized in that the group of plunger-shaped bodies has a geometry that enables at least a partial insertion of the group of plunger-shaped bodies into the crucible at a unilaterally identical distance to the lateral wall.

5. The device according to claim 2 or 4, characterized in that the plunger-shaped bodies have a continuous lateral projection at a distance from the lower plunger surface that makes it possible to cover an upper edge of the crucible.

6. The device according to claim 1 or 2, characterized in that the lower plunger surface is flat and arranged parallel to the supporting surface.

7. The device according to claim 1 or 2, characterized in that the geometry of the plunger-shaped body or group of plunger-shaped bodies is selected in such a way that the lateral distance to the lateral wall of the crucible measures ≤1 cm.

8. The device according to claim 1 or 2, characterized in that the gas purging device consists of a carbon-free material.

* * * * *